US007561083B2

(12) United States Patent
Anderson et al.

(10) Patent No.: US 7,561,083 B2
(45) Date of Patent: Jul. 14, 2009

(54) TESTING OF ANALOG TO DIGITAL CONVERTERS

(75) Inventors: David Anderson, Gurnee, IL (US); Jack Weimer, Grayslake, IL (US)

(73) Assignee: Eagle Test Systems, Inc., Buffalo Grove, IL (US)

( * ) Notice: Subject to any disclaimer, the term of this patent is extended or adjusted under 35 U.S.C. 154(b) by 0 days.

(21) Appl. No.: 11/933,038

(22) Filed: Oct. 31, 2007

(65) Prior Publication Data

US 2009/0109072 A1    Apr. 30, 2009

(51) Int. Cl.
*H03M 1/10* (2006.01)
(52) U.S. Cl. ..................... 341/120; 341/155
(58) Field of Classification Search .......... 341/120–155
See application file for complete search history.

(56) References Cited

U.S. PATENT DOCUMENTS

| | | | | |
|---|---|---|---|---|
| 5,063,383 | A * | 11/1991 | Bobba | 341/120 |
| 6,177,894 | B1 * | 1/2001 | Yamaguchi | 341/120 |
| 6,326,909 | B1 * | 12/2001 | Yamaguchi | 341/120 |
| 6,476,742 | B2 * | 11/2002 | Yamaguchi | 341/120 |
| 7,239,259 | B1 * | 7/2007 | Xu | 341/155 |
| 7,443,322 | B2 * | 10/2008 | Compagne | 341/120 |

OTHER PUBLICATIONS

International Search Report for related patent PCT/US08/11888 performed by International Searching Authority/US on Nov. 25, 2008.
Written Opinion of the International Searching Authority for related patent PCT/US08/11888 performed by International Searching Authority/US on Nov. 25, 2008.

* cited by examiner

*Primary Examiner*—Lam T Mai
(74) *Attorney, Agent, or Firm*—Mintz, Levin, Cohn, Ferris, Glovsky and Popeo, P.C.

(57) ABSTRACT

Methods and apparatus, including computer program products, to test analog to digital converters, are disclosed. In general, data is received that characterizes a first digital code from a device under test at a first analog voltage of an analog signal generator and a second digital code being a digital code threshold, and a step size is generated for another test of the device by performing a calculation by a processor. The calculation may include multiplying a least significant bit size of the device with a difference of the first and second digital codes to generate a product, and dividing the product by a least significant bit size of the analog signal generator. The first digital code may be calculated from results from multiple subtests in the test, where each of the subtests includes multiple analog to digital conversions by the device at the first analog voltage.

19 Claims, 4 Drawing Sheets

TESTING OF ANALOG TO DIGITAL CONVERTERS

BACKGROUND

The present disclosure relates to data processing by digital computer, and more particularly to testing of analog to digital converters.

In general, an analog to digital converter is a device that converts analog signals to digital codes that represent the analog signals. The digital codes may then be digitally processed as digital representations of the analog signals. For example, a digital code representing a sound may be processed using sound processing techniques.

One device characteristic of an analog to digital converter is a threshold at which a digital output changes from one digital code to another digital code. For example, an analog to digital converter may have a digital code of 0 when an analog input of zero volts is chosen as an input, and a digital code of 1 may only be output for an analog voltage of at least 0.1 volts (e.g., an analog voltage of 0.05 volts may result in a digital code of 0). Analog to digital converters may have multiple, independent digital code thresholds.

As manufacturing variations may result in a batch of analog to digital converters having varying thresholds, analog to digital converters may be tested to determine, for example, if a variance of a threshold of a device is within an acceptable range of variances. Testing many device thresholds may be time-consuming as, for example, many analog input voltages may need to be tested to determine each threshold voltage of a device under test.

SUMMARY

The subject matter disclosed herein provides methods and apparatus, including computer program products, that implement techniques related to testing of analog to digital converters.

In one, general aspect, data is received that characterizes a first digital code resulting from a device under a first test from a first analog voltage of an analog signal generator and a second digital code being a digital code threshold, and a first step size for a second test of the device is generated by performing a calculation. The calculation includes multiplying a least significant bit size of the device under the first test with a difference of the first digital code and the second digital code to generate a product, and dividing the product by a least significant bit size of the analog signal generator.

In a related aspect, data is received that characterizes a first digital code resulting from a device under a first test from a first analog voltage of an analog signal generator and a second digital code being a digital code threshold, and a first step size is generated for a second test of the device by performing a calculation by a processor processing instructions to perform the calculation.

In another related aspect, data is received that characterizes a first digital code resulting from a device under a first test from a first analog voltage of an analog signal generator and a second digital code being a digital code threshold, and a first step size is generated for a second test of the device, where the first step size is based on the first and second digital codes. The first digital code is calculated from results from multiple subtests in the first test, where each of the subtests includes multiple analog to digital conversions by the device at the first analog voltage.

The subject matter may be implemented as, for example, computer program products (e.g., as source code or compiled code), computer-implemented methods, hardware, and systems (e.g., systems including hardware, software, or both).

Variations may include one or more of the following features.

A digital code resulting from a device under the test may be a result of averaging multiple digital codes from the test, where the multiple digital codes are based on multiple analog to digital conversions by the device at a same input voltage.

Subsequent data may be received and a subsequent step size may be generated for further tests of the device by performing a subsequent calculation. Subsequent data may characterize a third digital code resulting from the device under a third test from a subsequent analog voltage. The subsequent calculation may include multiplying a least significant bit size of the device under the third test with a difference of the third digital code and the second digital code to generate a subsequent product, and dividing the subsequent product by a least significant bit size of the analog signal generator.

Receiving digital codes for further tests and generating a step size for the further tests may include using as further input to an analog signal generator a combination of a previous step size calculated from a previous test and further input to the analog signal generator from the previous test.

A third digital code may be generated as further input to an analog signal generator, where the third digital code is based on a combination of a step size and an input to the analog signal generator for an earlier test.

A second phase of testing of a device may include receiving as input a third digital code resulting from the device, and increasing or decreasing a fourth digital code used as input to an analog signal generator by a first fixed step size based on whether the third digital code is less than or greater than the second digital code. The second phase may include multiple tests based on multiple input voltages.

A third phase of testing of a device may include receiving as input a fifth digital code resulting from the device, and increasing or decreasing a sixth digital code used as input to an analog signal generator by a second fixed step size based on whether the fifth digital code is less than or greater than the second digital code, the second fixed step size being smaller than the first fixed step size. The third phase may include multiple tests based on multiple input voltages.

A fourth phase of testing of a device may include receiving as input a seventh digital code resulting from the device, storing the seventh digital code, and increasing or decreasing an eighth digital code used as input to an analog signal generator by a second fixed step size based on whether the seventh digital code is less than or greater than the second digital code. An average of the seventh digital code may be calculated over multiple tests in the fourth phase.

A device under test may be an analog to digital converter.

A step size may be stored for use in a subsequent test.

The subject matter described herein can be implemented to realize one or more of the following advantages. Testing of a digital code threshold of an analog to digital converter may include use of a processor such that a next input voltage level of an analog signal generator may be calculated using mathematical operations of an equation. The equation may use a difference between an ideal digital code threshold and one or more digital codes from conversions as a factor in calculating a step size and a step direction such that a threshold may be quickly reached. Multiple conversions may be performed per each decision of a next input voltage level of an analog signal generator such that, for example, inaccurate conversions that may result from noise have a reduced adverse effect to testing.

Details of one or more implementations are set forth in the accompanying drawings and in the description below. Further features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

In general, the description of FIGS. 1-4 includes subject matter related to testing analog to digital converters. As used in the description, an analog to digital converter may be a device that has a single purpose of converting analog signals to digital signals (e.g., digital codes); however, the term analog to digital converter need not be so limited and may include devices that have multiple purposes. For example, an analog to digital converter may include a digital music player that includes functionality for purposes other than converting analog signals to digital codes.

Figure 1:
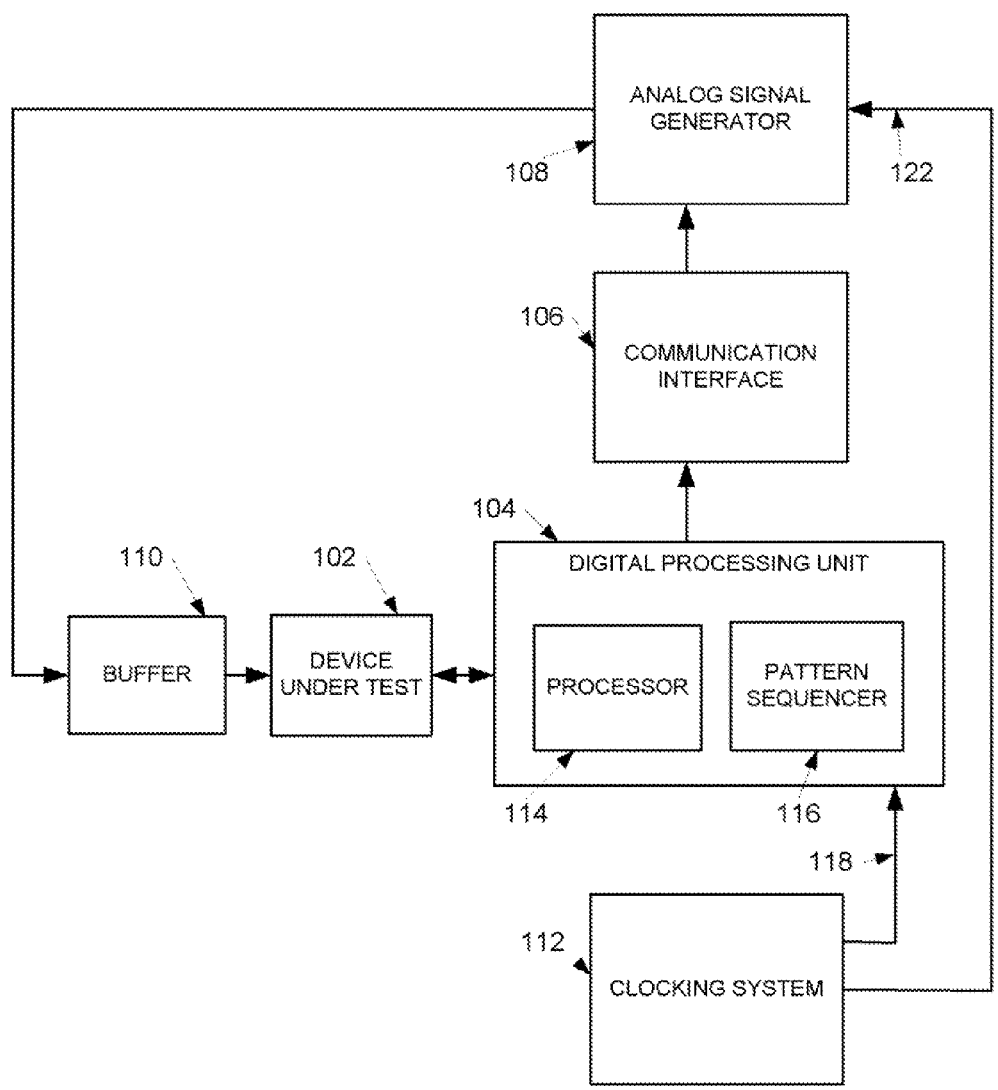
FIG. 1 is a diagram of a system to test analog to digital converters.

FIG. 1 is a diagram of a system 100 to test analog to digital converters. In the system 100, a device under test (DUT) 102 is an analog to digital converter that may be tested. In general, the DUT 102 may be tested by sending an analog signal from an analog signal generator 108 to an input of the DUT 102 and comparing the output of the DUT 102 with a digital input of the analog signal generator 108. Based on a difference between the output of the DUT 102 and a desired digital output (which may be referred to as an ideal digital output), a determination may be made as to whether the output of the DUT is higher or lower than the desired digital output such that the output of the analog signal generator 108 is to be higher or lower, respectively in further testing. After further testing, an estimate of a threshold of the DUT 102 may be determined. The threshold of the DUT 102 may be used to determine whether, for example, the DUT 102 is within an acceptable range of variance from an ideal threshold. If not, the DUT 102 may be discarded as part of a quality control procedure. Also, the estimation of the threshold of the DUT 102 may be used to make changes to compensate for variances of the DUT 102 (e.g., a firmware program that uses the DUT 102 may skew output to compensate for a variance).

In addition to the DUT 102 and the analog signal generator 108, the system 100 includes a digital processing unit 104, a communication interface 106, a buffer 110, and a clocking system 112. The digital processing unit 104 includes a processor 114 and a pattern sequencer 116. In general, the digital processing unit 104 may manage testing of the DUT 102 in the system 100 with the assistance of the clocking system 112. Managing testing of the DUT 102 may include the digital processing unit 104 sending an initial digital code for use by the analog signal generator 108 (e.g., the code being sent to the communication interface 106 to relay it to the analog signal generator 108 to generate an analog signal to be converted); starting the pattern sequencer 116 to receive digital codes from the DUT 102; determining how much to increase or decrease the analog input for further testing; and estimating a threshold value.

Within the digital processing unit 104, the processor 114 may perform comparisons and calculations (e.g., determine how much a digital code is to be raised or decreased for further testing); communicate with the communication interface 108; and determine how testing of the DUT is to be performed (e.g., determining a voltage to be generated by the analog signal generator 108, for example, by determining an initial voltage for a test and how much to increase or decrease a previous voltage used by the analog signal generator for further testing). For example, the processor 114 may be a digital signal processor that is optimized to perform mathematical calculations such that they may be performed at a relatively fast speed compared to other types of processors.

The pattern sequencer 116 of the digital processing unit 104 may perform management operations of the digital processing unit 104 for the system 100 and may be referred to as a pattern sequencer in the sense that a sequence of testing may be managed by the pattern sequencer 116. As examples of operations that may be performed as part of managing testing, the pattern sequencer may control the processor 114 (e.g., tell the processor 114 to aggregate and store values received by the DUT 102, compute an average of an aggregated values, and the like); trigger the DUT 102 to perform conversions (e.g., trigger a conversion by the DUT 102 each time a conversion is to be performed, where multiple conversions can be performed rapidly to generate data for a decision); determine whether to continue performing testing (e.g., determine an end of testing has been reached); and the like.

The communication interface 106 is an interface between the digital processing unit 104 and the analog signal generator 108. The communication interface 106 may act as a distributor of resources for scaling the system 100, may act as an adapter between the analog signal generator and the digital processing unit 104, or both. For example, the communication interface 106 may be a communication interface board that connects to a serial command bus of the digital processing unit 104 and other, similar digital processing units that may each have their own devices under test that desire resources of the analog signal generator 108 and connect to the digital processing unit 104 through other buses. In that example, the communication interface 106 may receive commands from the various digital processing units and determine for which DUT to request a signal to be generated from the analog signal generator through a serial command bus.

As another example, the communication interface 106 may receive commands from the digital processing unit 104 in one format (e.g., in accordance with one communication protocol, based on one particular type of physical connection, and the like) and interact with the analog signal generator 108 in a second format (e.g., in accordance with a second communication protocol, based on a different type of physical connection, and the like).

The communication interface 106 may provide a layer between the digital processing unit 104 and the analog signal generator 108 such that the system 100 may be easily scaled for additional devices under test and additional digital processing units 104 to manage testing of those devices. For example, the communication interface 106 may include a number of physical connections for digital processing units 104 and logic to manage potential digital processing units connected to the physical connections such that additional digital processing units may be easily added. Similarly, the communication interface 106 may provide a layer between the digital processing unit 104 and the analog signal generator 108 such that variations in components may be accepted. For example, the communication interface 106 may accept a variety of types of physical and software connections from digital processing units to interface with the analog signal generator 108. As another example, the analog signal generator 108 may have four or more independent channels, and the system 100 may support up to four or more digital processor units 104 to service up to four or more DUTs, similar to the DUT 102 such that the system 100 may be scaled to test more DUTs with only one communication interface 106 and one clocking system 112.

As described above, the analog signal generator 108 generates analog signals in response to commands, through the communication interface 106, from the digital processing unit 104. The analog signal generator 108 may generate analog signals by converting digital codes representing an analog signal to analog signals such that the analog signal generator 108 is a digital to analog converter. The analog signal generator 108 may be a high resolution (e.g., 24-bit length digital codes), high precision, high bandwidth analog signal generator, such as a QUAD PRECISION LINEARITY UNIT™ sold by EAGLE TEST SYSTEMS, INC. Such a signal generator may facilitate rapid and precise analog signal generation such that multiple device thresholds can be determined in a short amount of time.

The buffer 110 may buffer analog signals from the analog signal generator 108 prior to being converted by the DUT 102. For example, an analog signal may be conditioned to scale or otherwise optimize signal integrity for testing purposes. The buffer 110 may be provided by a test developer but need not be a part of the test system 100.

The clocking system 112 generates clock signals that may be used to synchronize actions of the system 100. In particular, the clocking system 100 is connected to the digital processing unit by a first connection 118 and the analog signal generator 108 by a second connection 122 through independent clock lines. For example, the clocking system 112 may initiate clock signals that drive the digital processing unit 104 to establish a time base for the pattern sequencer 116.

As described above, the system 100 may be implemented in hardware, software, or a combination of the two. For example, the DUT 102 may be a digital to analog converter implemented as a packaged hardware device that may plug into a testing board for communication during testing with the digital processing unit 104. As another example, the digital processing unit 104 may be a hardware device that includes a combination of a digital signal processor (as the processor 114), where the digital signal processor runs instructions encoded in a programmable media, such as electrically erasable programmable read-only memory, and a pattern sequencer hardware device (as the processor sequencer 116), where the pattern sequencer may be an application specific integrated circuit (ASIC) that includes programmable memory to store preferences of a testing sequence (e.g., a list of thresholds to test). As another example, the digital processing unit 104 may be implemented as a system on a chip. As another example, the communications interface 106 may be a communications interface board hardware device that includes a combination of ASICs to implement logic for communicating with the analog signal generator 108 and the digital processing unit 104. As another example, the analog signal generator 108 may be a digital to analog converter hardware device, as described above. Similarly, the buffer 110 may be a hardware buffer to enhance signal integrity of analog signals from the analog signal generator 108.

Although the system 100 of FIG. 1 includes a certain number and type of components, implementations may vary. For example, although FIG. 1 includes a one to one correspondence between the DUT 102 and the digital processing unit 104, that need not be the case. For example, there may be multiple devices tested by the digital processing unit 104. As another example, multiple devices under test may be paired with digital processing units and use a same analog signal generator.

As another example, the communication interface 106 need not exist and the digital processing unit 104 may connect directly to the analog signal generator 108. As another example, the buffer 110 need not exist or may be integrated with the analog signal generator 108.

Figure 2:
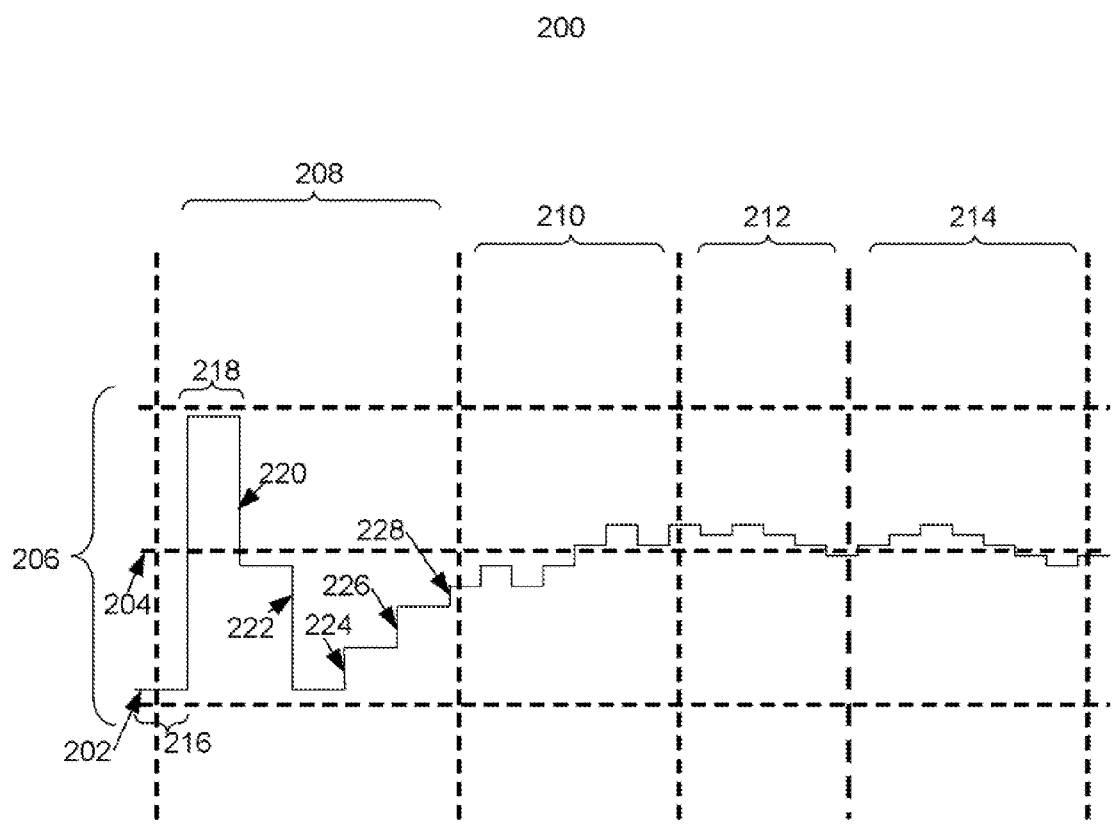
FIG. 2 is a graph illustrating a testing of an analog to digital converter.

FIG. 2 is a graph 200 illustrating a testing of an analog to digital converter. The testing may take place in a system, such as the system 100 of FIG. 1. In general, the testing is used to determine a threshold value of a device, the threshold defining an analog input level where a digital code output changes from one value to an adjacent value. For example, above and below a threshold analog input value, there may be different digital code outputs, resulting from a combination of transition noise 206 and a range of analog input values to an analog to digital converter under test.

The graph 200 illustrates the testing through an X-axis that represents time and a Y-axis that represents a voltage level. In the graph 200, a line 202 defines an input analog voltage applied to an analog to digital converter under test. The line 202 moves up and down as part of the testing process of a device under test (DUT) to determine the threshold value. A horizontal threshold line 204 is an estimate of a threshold value of the DUT. The horizontal threshold line 204 may be based on a result of the testing (e.g., it might not be known before testing). The area 206 between two horizontal lines may be referred to as a transition noise region, which may define a region where output digital codes are either one of two or more codes, with the threshold line 204 defining the middle of the analog input region where the output of the digital code switches. For example, some DUTs may have noise that is larger than one LSB of the DUT, such that there may be three or four codes of "bobble" that may be within a transition noise region.

In general, the testing in the graph 200 involves four phases of testing, including a first phase 208, a second phase 210, a third phase 212, and a fourth phase 214. Each of the four phases involves a particular technique of testing where a new level of an input voltage is determined based on a previous input voltage and potentially other factors. The techniques used to test the analog to digital device may be referred to as transition intercept, fast dither, slow dither, and slow dither with estimate for each of the four phases 208, 210, 212, 214, respectively. A user may independently predetermine actions of each testing phase, including a number of decisions per a testing phase (e.g., a real number between one and ten), the number of DUT conversions per decision (e.g., a real number between one and ten), and a magnitude of change in input voltage level per decision.

Between each input voltage level in the graph 200, a decision is made as to a next input voltage to be applied to a DUT. Each of those decisions may be based on multiple analog to digital conversions by a DUT. For example, a number of conversions may be performed at the initial voltage 216 and the results from those conversions may be used to determine a next input voltage, which is the second voltage level 218. The results of multiple conversions may be used to make a determination, as examples, by averaging the digital codes of the conversions, filtering out digital codes that have a significant deviance from an expected digital code, or both.

In general, using multiple conversions per a decision of an input level may be advantageous, as examples, because it may filter out erroneous conversion responses that may be due to noise (e.g., if a digital code is at least a threshold number of codes away from the digital code of interest, the code may be assumed to be erroneous and may be filtered out), may average multiple conversions due to dithering, and the like. For example, due to measurement noise inherent to high resolution analog to digital converters, a digital response from a DUT may involve a number of digital codes, thus averaging may reduce the effect of this noise on decisions. Multiple conversions per a decision of an input level may be possible while maintaining an overall efficient testing time, for example, due to a quick conversion speed of a model of analog to digital converter being tested. Thus, in general, effects of measurement noise may be reduced through averaging, which may result in making more accurate decisions while taking advantage of high conversion rates of modern analog to digital converters. For example, a decision loop itself may be limited to around 400 kHz (kilohertz) operation, but some devices may convert at rates beyond 10 MHz; without an ability to support multiple conversions per decision, a conversion rate during testing would be limited to 400 kHz maximum, thus causing a significant reduction in test efficiency.

As part of starting testing, an initial voltage 216 is used as input. The initial voltage may be a predetermined value that is configured by a user of a test system. For example, for a specific model of analog to digital converters, to test a particular threshold, an initial voltage may be chosen that is expected to be near the threshold.

In the first phase, based on multiple conversions at a voltage level, a determination of a new voltage level may be made. For example, after performing multiple conversions at the initial voltage 216, a determination as to the second voltage level 218 may be made. The transition intercept technique of the first phase describes how a new input voltage level is determined. In particular, a new input voltage level may be determined in accordance with the equation (which may be referred to as the transition intercept equation):

((Expected digital code of the threshold−Digital code from conversion(s))×Least Significant Bit (LSB) size of the DUT)/LSB size of the analog signal generator.

In this equation, the expected digital code of the threshold may be chosen by a user of a test system, such as a user of the test system 100, for example, as the digital code of the threshold in an ideal analog to digital converter. The digital code from one or more conversions may be the output of the DUT from one or more conversions. For example, if multiple conversions per a decision are used, then digital codes from multiple conversions may be averaged and the "digital code from conversion(s)" may be the average. The average may be rounded based on a LSB size of a DUT (in implementations rounding need not be performed). The units of the difference between the expected digital code of the threshold and the digital code from one or more conversions may be a result of binary or decimal subtraction with, for example, a resolution matching that of the analog signal generator. The LSB of the DUT is a measure of the smallest step size of the DUT. For example, if the DUT is a two-bit analog to digital converter for voltages from zero to four volts, the smallest step size may be one volt. The LSB size of the analog signal generator is a measure of the smallest step size possible of an analog signal generator. For example, if the analog signal generator is a three bit digital to analog converter of voltages between zero and four volts, the smallest step may be half a volt.

As an example application of the transition intercept equation, if a four bit converter of voltages between 0 and 4 volts were a device to be tested, the digital code 0100 may correspond to voltage levels between 0.875 and 1.125 volts such that 1.125 volts may be an ideal high side transition threshold of the code, with the actual high side transition threshold line 204 being located near 1.200 volts, where the actual high side threshold voltage of the DUT is not ideal. A series of five conversions with an input voltage of 1.125 volts may yield digital codes of 0100 (decimal 4), 0101 (decimal 5), 0101, 0100, and 0011 (decimal 3; e.g., codes may differ from the ideal conversion based on characteristics of the DUT, may differ based on noise, or both), such that an average of the codes may be 4.0 LSB or 1.0 volts (e.g., decimal 21 divided by 5 is decimal 4.2, which may be rounded to the nearest LSB size of the DUT to reach 4.0 (in implementations rounding need not be performed)). The LSB size of the device under test and the analog signal generator may be 0.25 and 0.025, respectively. Thus, the equation may yield a result of 5 LSB of an analog signal generator or 0.125 volts (((4.5 LSB−4.0 LSB)×0.250 volts)/0.025 volts), which indicates that a next level of an input voltage is desired to be 0.125 volt more than the previous input voltage, or 1.250 volts.

The process of determining input voltage levels and testing the input voltage levels may continue for any number of input voltage levels to be part of the first phase 208. In the graph 200, the process continues with five more determinations of input voltage levels as illustrated by a series of five falling and rising edges 220, 222, 224, 226, 228. The input voltage level of at the end of the first phase 208 is used as an initial input voltage level for the second phase 210.

As described above, the second phase 210 involves a technique that may be referred to as fast dither. In general, fast dither of the second phase 210 involves moving a test input voltage level up or down by a predetermined, fixed magnitude based on the digital code output resulting from one or more conversions of the analog to digital converter under test. The magnitude may be predetermined in the sense that a user of a test system may determine a fast dither magnitude. The magnitude may be fixed in the sense that for any number of decisions in the second phase 210, the magnitude is the same. Fast dither of the second phase 210 may differ from slow dither of the third and fourth phases 212, 214 in that fast dither involves a larger fixed magnitude than slow dither such that a test input voltage may move up or down by larger magnitudes, and may differ in the number of decisions. Any number may be chosen as a fast and slow dither magnitude, and as a number of decisions for fast and slow dither.

Based on a result of one or more conversions, a next input voltage level is determined as being higher or lower depending on whether the result is higher than the ideal digital code threshold.

Following the previous example with the four bit analog to digital converter under test, a fast dither voltage may be 0.5 volts and the threshold of 1.125 volts may be tested. In that example, if a series of conversions by a test analog to digital converter results in the series of digital codes 0100, 0011, 0010, 0011, and 0011 a resulting voltage from the multiple conversions that is used to determine the next input voltage level may be 0.75 volts (0011). As 0.75 is less than 1.125 volts, a decision may be made to increase the input voltage level by the fixed magnitude of 0.5 volts to 1.25 volts for a next series of conversions.

After a fixed number of tests at input voltage levels and decisions in the second phase 210, the third phase 212 may start with a smaller dither size and an initial voltage from the second phase 210. Following the previous example, a slow dither size is smaller than the fast dither size and may be, for example, 0.0125 volts (the slow dither size may be one twentieth the LSB size of the device under test or smaller).

After a fixed number of tests at input voltage levels and decisions in the third phase 212, the fourth phase 214 may start with a same dither size as the third phase 212. As described above, in contrast to the third phase 212, the fourth phase 214 may include estimating a threshold value based on results of the test input voltage levels. To generate an estimated threshold value, test input voltage levels may be accumulated and the accumulated number may be divided by a number of test input voltage levels to determine an estimated threshold voltage of the analog to digital converter under test. For example, a series of eight input voltage levels resulting from decisions in the fourth phase 214 may be accumulated and an average may be computed based on there being eight input voltage levels. Implementations of generating an estimate may vary. For example, a starting input voltage level of the fourth phase 214 may be included in an average that is computed and the input voltages used for generating the average need not be limited to those resulting from decisions in the fourth phase 214. As another example, only a subset of input voltage levels from the fourth phase 214 may be used (e.g., the last two or more input voltage levels).

An estimate of a threshold voltage may be used, for example, to determine integral non-linearity (INL) errors (e.g., using multiple threshold values against ideal thresholds of a device), positive or negative full scale errors, and the like, which may be used for quality assurance or to adjust a system. For example, multiple estimates of threshold values of a device may be used to compute INL of a DUT and if the device has an INL above a threshold magnitude, the device might be discarded as being of insufficient quality.

Although the graph 200 of FIG. 2 includes a certain number of phases, each having a particular technique, variations may differ. For example, the techniques may differ or the number of phases may differ. For example, although the first phase 208 was described as including the transition intercept technique, in some implementations a binary search technique may be used, instead. A binary search technique may include increasing or decreasing an input voltage level by a first, fixed magnitude (which may be referred to as a binary step size magnitude) based on whether an output digital code is below or above an ideal digital code threshold, and then based on later conversions repeating an increase or decrease of the input voltage level by half of the last magnitude used for an increase or decrease (where the magnitude used may also be referred to as the binary step size magnitude).

As an example application of a binary search technique, a first test input voltage level may be 1.0 volts and a digital code from one or more conversions may be above the ideal digital code of the threshold, such that the input test voltage may be decreased by 0.4 volts to 0.6 volts. Then, in a subsequent test, based on a second input test voltage of 0.6 volts, the resulting digital code from one or more conversions may be below the ideal digital code of the threshold such that the input test voltage is increased by 0.2 volts (which is half of 0.4 volts, the previous step size) to a test input voltage level of 0.8 volts. Following that example, the testing may continue for a predetermined number of steps, while continuing to increase or decrease the input voltage level by a fixed magnitude.

As another example, testing of a device may only include three phases. For example, after the second phase 210, a slow dither with estimate phase similar to the fourth phase 214 may be used and there need not be a fourth phase.

In some implementations, multiple conversions may only be used for some decisions. For example, only the first phase 208 may include causing multiple analog to digital conversions per an input test voltage level before determining a new input test voltage level.

The four phases described with reference to FIG. 2 may be performed any number of times to determine multiple thresholds of a device. For example, the four phases may first be used with a first initial voltage to determine a first threshold value between a first set of two digital codes, then the four phases may be used with a second initial voltage to determine a second threshold value between a second set of two digital codes.

Figure 3:
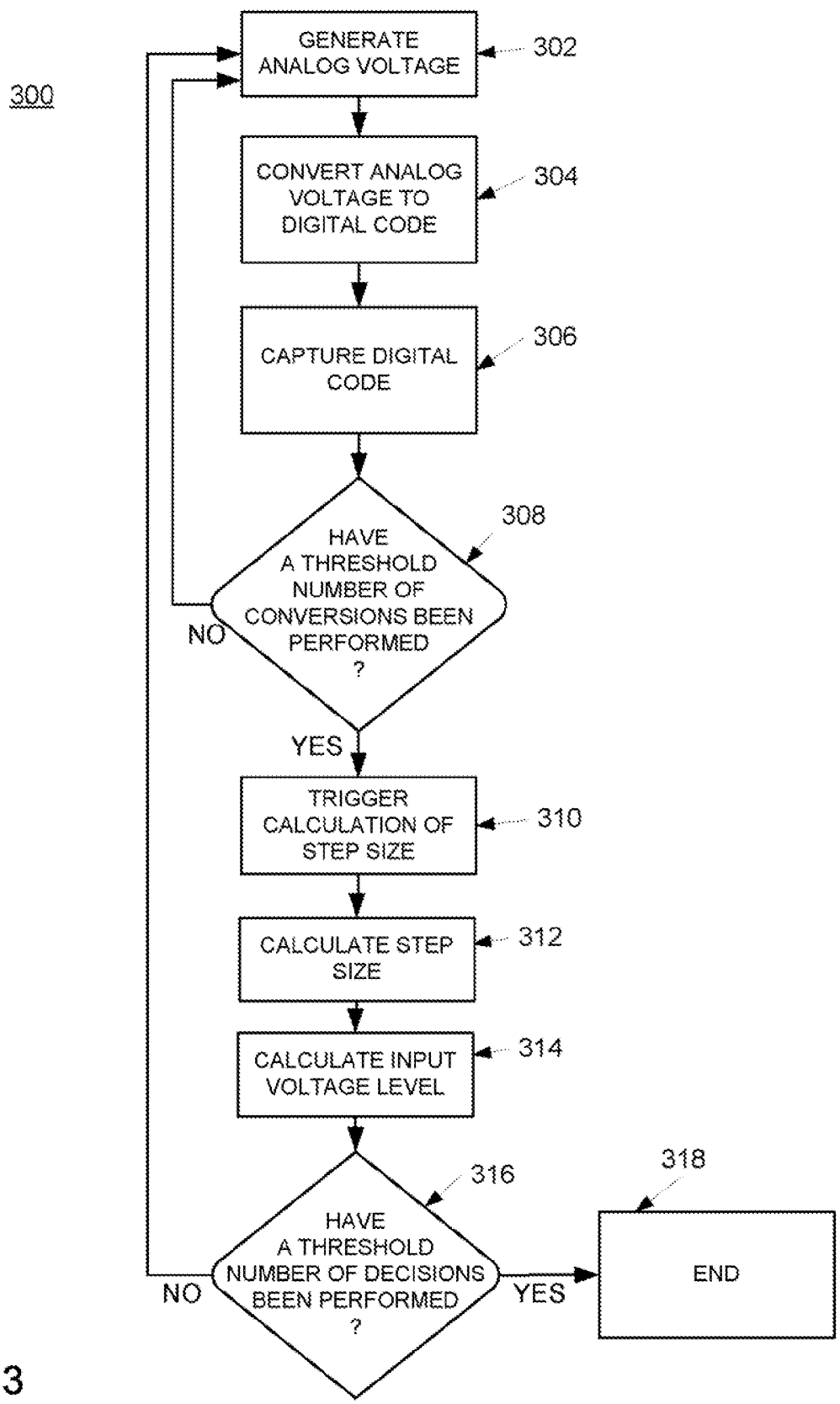
FIG. 3 is a flowchart illustrating a process of testing analog to digital converters.

FIG. 3 is a flowchart illustrating a process 300 of testing analog to digital converters. The process 300 involves testing an analog to digital converter according to a form of testing that may be referred to as transition intercept, which is similar to the transition intercept technique described with reference to the first phase 208 of the graph 200 of FIG. 2 such that the process 300 may involve that technique described with reference to FIG. 2. The process 300 may be part of a larger testing process similar to how the first phase 208 of FIG. 2 is part of a larger testing process that involves four phases. The process 300 may be performed in a testing system, such as the system 100 of FIG. 1.

In general, the process 300 involves generating an analog voltage (302); converting the analog voltage to digital code (304); capturing the digital code (306); determining whether a threshold number of conversions have been performed (308); triggering calculation of a step size (310) if the threshold number of conversions have been performed, or, otherwise, returning to generating an analog voltage (302); calculating a step size if triggered (312); calculating an input voltage level (314); determining whether a threshold number of decisions have been performed (316); and, if so, ending the process 300 or, otherwise, returning to generating an analog voltage (302).

Generating an analog voltage (302) includes generating an analog voltage for a device under test (DUT). The voltage may be a fixed, initial voltage (e.g., pre-configured by a user to test a particular threshold) or a voltage determined based on a calculation (e.g., based on a calculated step size (312)). The voltage may be generated by an analog signal generator, such as the analog signal generator 108 of FIG. 1. An input from which an analog voltage may be generated may be a digital code that may, for example, be determined by a processor or pattern sequencer, such as the processor 114 or the pattern sequencer 116 of FIG. 1, and, for example, a processor may cause the analog signal generator 108 to generate the signal (e.g., by sending a command to an analog signal generator).

Converting an analog voltage to digital code (304) is performed by a DUT, such as the DUT 102 of FIG. 1. The device may be a specific-purpose analog to digital converter or a device including functionality for analog to digital conversion. The conversion may be triggered, for example, by a pattern sequencer, such as the pattern sequencer 116 of FIG. 1.

Capturing a digital code, which represents the result of the conversion may be performed, for example, by a digital processing unit, such as the digital processing unit 104 (e.g., in volatile memory). For example, if multiple conversions are to be performed per a decision, a number of results of conversions may be stored to compute a result, such as an average, that is used to determine a step size.

Determining whether a threshold number of conversions have been performed (308) may involve comparing a threshold number of conversions against a number of conversions that have been performed. The determination may be performed by a pattern sequencer. A threshold number of conversions may be a predetermined number (e.g., configured by a user of a test system) that defines a number of conversions performed per a decision.

If a threshold number of conversions have not been performed, an analog voltage may be generated (302), where the analog voltage that is used is the same as the analog voltage used for the last conversion. If a threshold number of conversions have been performed, the process 300 may continue with triggering a calculation of a step size (308), which may be referred to as a transition intercept step size.

The triggering of the calculation may be performed by a pattern sequencer and the step size may be calculated (312) by a processor. The step size may be calculated in accordance with the equation described above and the equation may use a result of multiple conversions. In some implementations, to potentially reduce error (e.g., if a calculated step size is based on inaccurate conversions due to noise), a step size calculated in accordance with the equation may be bound by a binary search step size (e.g., such that a calculated step size does not erroneously veer too far from a threshold if the calculation was in error due to an inaccurate conversion). For example, a binary search step size may act as a floor or ceiling of a decrease or increase, respectively, of a step size calculated in accordance with the transition intercept equation (e.g., a calculated step size may be considered a bad calculation if it is outside of the bounds of a binary search step size).

The result of the step size calculation may then be used to calculate an input voltage level (314), which may be used in later testing or to determine an estimate of a threshold voltage level of a DUT. As the equation for calculating a step size depends on a difference between a digital code resulting from one or more conversions and a desired digital code, the equation may result in a more accurate calculation of a new input voltage level because the input voltage level may increase or decrease by a magnitude proportional to the difference such that, for example, a threshold voltage might not be greatly overstepped. Calculating the step size, calculating a next input voltage level, or both may be referred to as a decision.

If a threshold number of decisions have been performed (316), the process 300 may end (318); otherwise, the process 300 may continue with generating an analog voltage (302), where the analog voltage is based on the step size. The determination of whether a threshold number of decisions have been performed may be made by a pattern sequencer.

Thus, based on the determination as to whether a threshold number of decisions have been performed, the process 300 may continue with generating a number of analog voltages for an input voltage level, performing conversions for the number of analog voltages, calculating a step size for a new input voltage level, and returning to calculate analog voltages at the new input voltage level. After a threshold number of decisions have been performed, an input voltage level may be nearer to a threshold value of a device.

The calculation of a next input voltage level based on a difference of one or more conversions, and an ideal conversion as compared to other techniques, such as binary search, may improve testing performance, by, as examples, reducing a number of decisions to get close to a threshold, which may reduce a magnitude of time spent testing, or reducing time resulting from errors. For example, while binary search may require a number of decisions to reach a threshold equivalent to a square root of a resolution of a device being testing, two or three decisions may result in an input voltage level at the threshold of a device such that testing may be configured to have fewer decisions. As another example, if noise causes inaccurate conversions, binary search may result in a large increase or decrease of an input voltage in a direction away from a threshold, which may require numerous decisions to correct, while, the transition intercept equation may compensate for error in fewer decisions due to the equation generating a step size proportional to the difference between digital codes from one or more conversions and a desired digital code.

Figure 4:
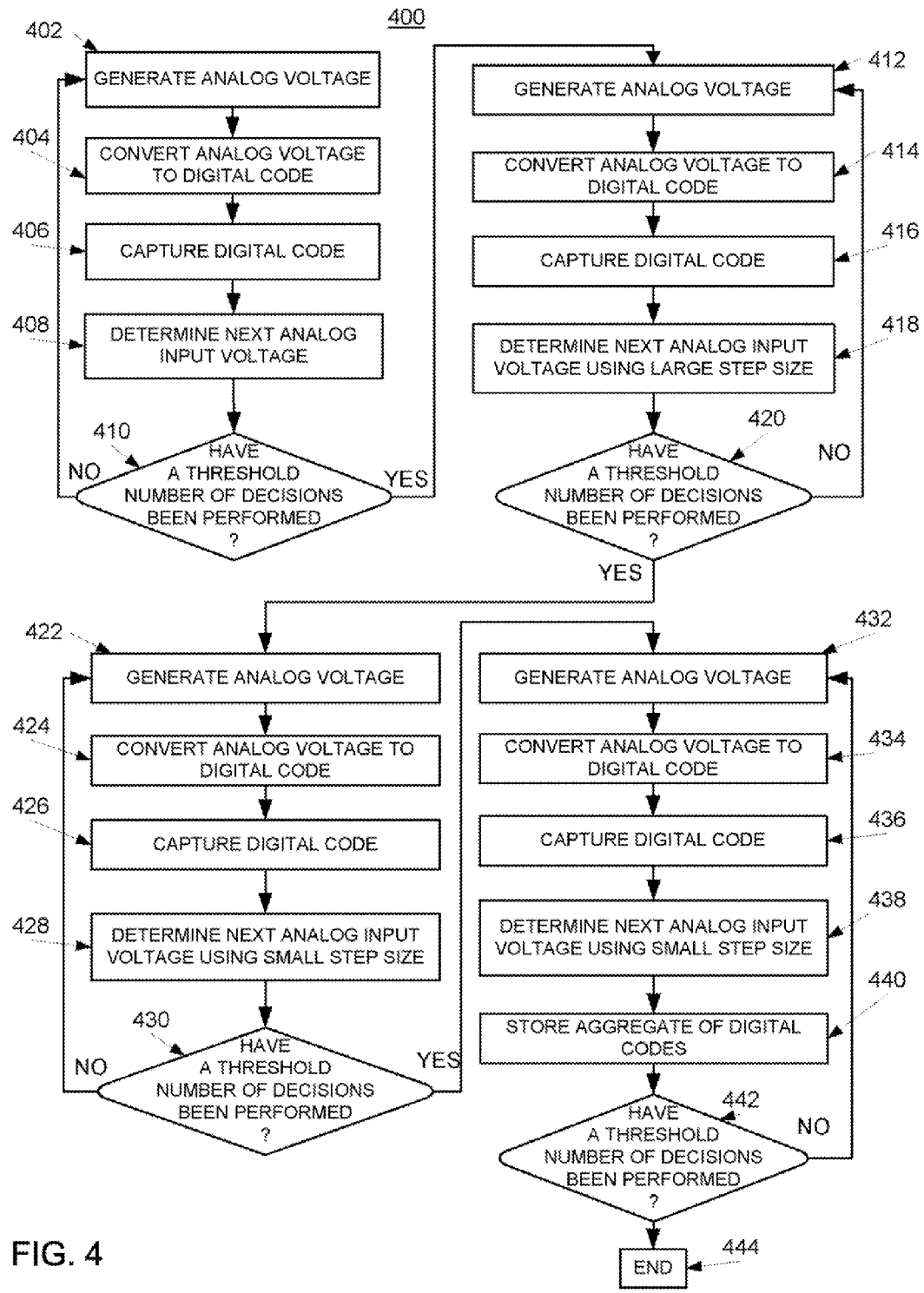
FIG. 4 is a flowchart illustrating a process of testing analog to digital converters.

FIG. 4 is a flowchart illustrating a process 400 of testing analog to digital converters. The process 400 may describe sub-processes that result in the graph 200 of FIG. 2 and may be performed by components of the system 100 of FIG. 1. In general, the process 400 includes what may be referred to as four testing phases, each of which may correspond to the testing phases of FIG. 2, including a first phase (402, 404, 406, 408, 410), a second phase (412, 414, 416, 418, 420), a third phase (422, 424, 426, 428, 430), and a fourth phase (432, 434, 436, 438, 440, 442).

The first phase includes generating an analog voltage (402), converting an analog voltage to digital code (404), capturing a digital code (406), determining a next analog input voltage (408), and determining whether a threshold number of decisions have been performed (410). The first phase may involve a transition intercept technique that uses a transition intercept equation, as described above. For example, the analog voltage that is generated (402) may be a predetermined initial voltage or a voltage calculated based on a transition intercept equation, which may be generated by an analog voltage generator, such as the analog voltage generator 108 of FIG. 1. Converting an analog voltage to digital code (404) may be performed by a DUT, and the conversion may be triggered by a pattern sequencer. Capturing the digital code (406) may involve capturing the digital code of the DUT and may be performed by a digital processing unit, such as the digital processing unit 104 of FIG. 1. Determining a next analog input voltage (408) may be performed by a processor, such as the processor 114 of FIG. 1, which may be a digital signal processor. Determining a next analog input voltage may be triggered by a pattern sequencer. The next analog input voltage may be calculated by calculating a step size in accordance with the transition intercept equation described above, which may be negative or positive to indicate whether the input voltage level is to be decreased or increased, respectively. Determining whether a threshold number of decisions have been performed (410) may be performed by a pattern sequencer. If a threshold number of decisions have not been performed, the input voltage level that was determined may be used to generate another analog voltage (402) for another decision, where a decision may be a determination of a next input voltage level. A threshold number of decisions may be predetermined by a user of a test system. For example, a user may configure, through a graphical user interface, preferences of a testing sequence to include four decisions for a first phase of testing of a particular threshold.

If a threshold number of decisions have been performed in the first phase, the process 400 may continue with the second phase by generating an analog voltage using the input analog voltage calculated in the first phase (e.g., at 408). The second phase may involve a technique of fast dither and includes generating an analog voltage (412), converting an analog voltage to digital code (414), capturing a digital code (416), determining a next input voltage using a large step size (418), and determining whether a threshold number of decisions have been performed (420). Similar to the first phase, the analog voltage may be generated by an analog voltage generator, the conversion may be performed by a DUT, the capturing the digital code may be performed by a digital processing unit, and determining whether a threshold number of decisions have been performed may be performed by a pattern sequencer. However, in contrast to the first phase, the second phase involves determining a next input voltage using a large step size, which may be performed by a processor or a pattern sequencer of a digital processing unit, depending on an implementation. The large step size may be predetermined by a user of a test system and the step size may be large, in the sense, that it is larger than a small step size used for slow dither. A next input voltage may be increased or decreased from a current input voltage based on whether the digital code that was captured is less than or greater than an ideal digital code of a threshold under test.

The third phase may involve a technique of slow dither and includes generating an analog voltage (422), converting an analog voltage to digital code (424), capturing a digital code (426), determining a next input voltage using a small step size (428), and determining whether a threshold number of decisions have been performed (430). Sub-processes of the third phase may be implemented similar to the second phase, except that a step size that is smaller than the step size used for the second phase may be used. For example, the step size may of the third phase be one half of the step size used for the second phase. The step size used for the slow dither technique may be based on an LSB size of an analog signal generator or a device under test. The large step size may also be based on the LSB size of an analog signal generator or a device under test. For example, the large step size may be twice the LSB size. In any case, a step size for a dither technique is a real number that is a fraction of a range of voltages that may be generated by an analog signal generator.

The fourth phase, similar to the third phase, may also involve a technique of slow dither except that an aggregate of digital codes may be stored. The fourth phase includes generating an analog voltage (432), converting an analog voltage to digital code (434), capturing a digital code (436), determining a next input voltage using a small step size (438), storing an aggregate of digital codes (440), and determining whether a threshold number of decisions have been performed (442). Sub-processes of the fourth phase may be implemented similar to the third phase, except with the addition of the storing of aggregate digital codes (440). The aggregate digital codes that are stored may be the digital codes of a next analog input voltage that result from the determination of a next analog input voltage (438). The aggregation may be performed by a processor. The small step size of the fourth phase may be the same as the small step size of the third phase.

Although the processes 300, 400 of FIGS. 3-4 include a certain combination, number, and type of sub-processes, implementations may vary. For example, as described above, the transition intercept equation used to calculate a step size may be bound by a binary search step size. As another example, the first phase of process 400 may implement a binary search technique. As another example, although the process 400 of FIG. 4 is implemented for a single conversion per a decision, the process 400 may be changed to allow for multiple conversions per a decision. Similarly, the process 300 of FIG. 3 may be implemented for a single conversion per a decision and the sub-process to determine whether a threshold number of conversions have been performed may be removed. As another example, an estimate of a threshold of a DUT may be calculated in the process 400 as an average of the decisions of the fourth phase by dividing the aggregate of digital codes by a number of decisions. As another example, the slow dither magnitude of the fourth phase of the process 400 may be even smaller than the slow dither magnitude of the third phase. As another example, a pattern sequencer that triggers a processor to perform an operation, such as calculate a step size in accordance with the transition intercept equation described above, may wait a pre-programmed amount of time for the processor to perform the calculation.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other in a logical sense and typically interact through a communication network. The relationship of client and server arises by virtue of computer programs running on the respective computers and having a client-server relationship to each other.

The subject matter described herein has been described in terms of particular embodiments, but other embodiments can be implemented and are within the scope of the following claims. For example, operations can differ and still achieve desirable results. In certain implementations, multitasking and parallel processing may be preferable. Other embodiments are within the scope of the following claims

What is claimed is:

1. A method comprising:
   receiving data characterizing:
      a first digital code resulting from a device under a first test from a first analog voltage of an analog signal generator; and
      a second digital code being a digital code threshold; and
   generating a first step size for a second test of the device by performing a calculation comprising:
      multiplying a least significant bit size of the device under the first test with a difference of the first digital code and the second digital code to generate a product; and
      dividing the product by a least significant bit size of the analog signal generator.

2. The method of claim 1, wherein the first digital code resulting from the device under the first test comprises a digital code resulting from averaging multiple digital codes from the first test, the multiple digital codes based on multiple analog to digital conversions by the device.

3. The method of claim 1 further comprising:
   receiving subsequent data for subsequent tests, the subsequent data characterizing a third digital code resulting from the device under a third test from a subsequent analog voltage; and
   generating a subsequent step size for subsequent tests of the device by performing a subsequent calculation comprising:
      multiplying the least significant bit size of the device under the third test with a difference of the third digital code and the second digital code to generate a subsequent product; and
      dividing the subsequent product by the least significant bit size of the analog signal generator.

4. The method of claim 1 further comprising:
   performing the receiving and the generating for each of a plurality of further tests using as further input to the analog signal generator a combination of a previous step size calculated from a previous test and further input to the analog signal generator from the previous test.

5. The method of claim 1 further comprising:
   generating a third digital code as further input to the analog signal generator, the third digital code based on a combination of the step size and input to the analog signal generator for the first test.

6. The method of claim 1 further comprising:
   performing a second phase of testing of the device, the second phase comprising, for each of a plurality of tests in the second phase:
      receiving as input a third digital code resulting from the device; and
      increasing or decreasing a fourth digital code used as input to the analog signal generator by a first fixed step size based on whether the third digital code is less than or greater than the second digital code;
   performing a third phase of testing of the device, the third phase comprising, for each of a plurality of tests in the third phase:
      receiving as input a fifth digital code resulting from the device; and
      increasing or decreasing a sixth digital code used as input to the analog signal generator by a second fixed step size based on whether the fifth digital code is less than or greater than the second digital code, the second fixed step size being smaller than the first fixed step size;
   performing a fourth phase of testing of the device, the fourth phase comprising, for each of a plurality of tests in the fourth phase:
      receiving as input a seventh digital code resulting from the device;
      storing the seventh digital code; and
      increasing or decreasing an eighth digital code used as input to the analog signal generator by a second fixed step size based on whether the seventh digital code is less than or greater than the second digital code; and
   calculating an average of the seventh digital code over the plurality of tests in the fourth phase.

7. The method of claim 1, wherein the device is an analog to digital converter.

8. The method of claim 1, wherein the first step size is stored for use in a subsequent test.

9. A method comprising:
   receiving data characterizing
      a first digital code resulting from a device under a first test from a first analog voltage from an analog signal generator; and
      a second digital code being a digital code threshold; and
   generating a first step size for a second test of the device by performing a calculation based on a difference of the first digital code and the second digital code.

10. The method of claim 9, wherein the generating the first step size comprises the processor:
    multiplying a least significant bit size of the device under the first test with a difference of the first digital code and the second digital code to generate a product; and
    dividing the product by a least significant bit size of the analog signal generator.

11. The method of claim 9, wherein the first digital code resulting from the device under the first test comprises a digital code resulting from averaging multiple digital codes from the first test, the multiple digital codes based on multiple analog to digital conversions by the device.

12. The method of claim 9 further comprising:
    performing the receiving and the generating for each of a plurality of further tests using as further input to the analog signal generator a combination of a previous step size calculated from a previous test and further input to the analog signal generator from the previous test.

13. The method of claim 9 further comprising:
performing a second phase of testing of the device, the second phase comprising, for each of a plurality of tests in the second phase:
receiving as input a third digital code resulting from the device; and
increasing or decreasing a fourth digital code used as input to the analog signal generator by a first fixed step size based on whether the third digital code is less than or greater than the second digital code;
performing a third phase of testing of the device, the third phase comprising, for each of a plurality of tests in the third phase:
receiving as input a fifth digital code resulting from the device; and
increasing or decreasing a sixth digital code used as input to the analog signal generator by a second fixed step size based on whether the fifth digital code is less than or greater than the second digital code, the second fixed step size being smaller than the first fixed step size;
performing a fourth phase of testing of the device, the fourth phase comprising, for each of a plurality of tests in the fourth phase:
receiving as input a seventh digital code resulting from the device;
storing the seventh digital code; and
increasing or decreasing an eighth digital code used as input to the analog signal generator by a second fixed step size based on whether the seventh digital code is less than or greater than the second digital code; and
calculating an average of the seventh digital code over the plurality of tests in the fourth phase.

14. A method comprising:
receiving data characterizing:
a first digital code resulting from a device under a first test from a first analog voltage of an analog signal generator, the first digital code being calculated from results from a plurality of subtests in the first test, each of the subtests comprising multiple analog to digital conversions by the device at the first analog voltage; and
a second digital code being a digital code threshold; and
determining a first step size for a second test of the device, the first step size based on the first and second digital codes.

15. The method of claim 14, wherein the determining the first step size is performed by a processor.

16. The method of claim 14, wherein the determining the first step size comprises the processor:
multiplying a least significant bit size of the device under the first test with a difference of the first digital code and the second digital code to generate a product; and
dividing the product by a least significant bit size of the analog signal generator.

17. The method of claim 14, wherein the first digital code resulting from the device under the first test comprises a digital code resulting from averaging multiple digital codes from the first test, the multiple digital codes based on multiple analog to digital conversions by the device.

18. The method of claim 14 further comprising:
performing the receiving and the determining for each of a plurality of further tests using as further input to the analog signal generator a combination of a previous step size calculated from a previous test and further input to the analog signal generator from the previous test.

19. The method of claim 14 further comprising:
performing a second phase of testing of the device, the second phase comprising, for each of a plurality of tests in the second phase:
receiving as input a third digital code resulting from the device; and
increasing or decreasing a fourth digital code used as input to the analog signal generator by a first fixed step size based on whether the third digital code is less than or greater than the second digital code;
performing a third phase of testing of the device, the third phase comprising, for each of a plurality of tests in the third phase:
receiving as input a fifth digital code resulting from the device; and
increasing or decreasing a sixth digital code used as input to the analog signal generator by a second fixed step size based on whether the fifth digital code is less than or greater than the second digital code, the second fixed step size being smaller than the first fixed step size;
performing a fourth phase of testing of the device, the fourth phase comprising, for each of a plurality of tests in the fourth phase:
receiving as input a seventh digital code resulting from the device;
storing the seventh digital code; and
increasing or decreasing an eighth digital code used as input to the analog signal generator by a second fixed step size based on whether the seventh digital code is less than or greater than the second digital code; and
calculating an average of the seventh digital code over the plurality of tests in the fourth phase.

* * * * *